(12) United States Patent
Steckl et al.

(10) Patent No.: US 6,635,306 B2
(45) Date of Patent: Oct. 21, 2003

(54) LIGHT EMISSIVE DISPLAY WITH A BLACK OR COLOR DIELECTRIC LAYER

(75) Inventors: Andrew J. Steckl, Cincinnati, OH (US); Jason C. Heikenfeld, Cincinnati, OH (US)

(73) Assignee: University of Cincinnati, Cincinnati, OH (US)

( * ) Notice: Subject to any disclaimer, the term of this patent is extended or adjusted under 35 U.S.C. 154(b) by 117 days.

(21) Appl. No.: 09/887,151

(22) Filed: Jun. 22, 2001

(65) Prior Publication Data

US 2002/0195932 A1 Dec. 26, 2002

(51) Int. Cl.[7] .......................... H05B 33/22; B05D 5/06; B05D 5/12
(52) U.S. Cl. ............................. 427/66; 427/58; 427/64; 427/68; 427/162; 427/164; 427/165; 427/226
(58) Field of Search .......................... 427/58, 64, 66, 427/68, 162, 164, 165, 226

(56) References Cited

U.S. PATENT DOCUMENTS

| | | | | |
|---|---|---|---|---|
| 4,853,079 A | * | 8/1989 | Simopoulos et al. | 216/25 |
| 5,049,780 A | | 9/1991 | Dobrowolski et al. | 313/509 |
| 5,068,157 A | * | 11/1991 | Won | 428/670 |
| 5,140,450 A | | 8/1992 | Nikaido | 349/158 |
| 5,432,015 A | | 7/1995 | Wu et al. | 428/690 |
| 5,464,566 A | * | 11/1995 | Ito et al. | 252/582 |
| 5,504,389 A | | 4/1996 | Dickey | 313/506 |
| 5,528,102 A | * | 6/1996 | Gnade et al. | 313/496 |
| 5,606,225 A | * | 2/1997 | Levine et al. | 315/169.3 |
| 5,627,429 A | * | 5/1997 | Iwasaki | 313/474 |
| 5,756,147 A | * | 5/1998 | Wu et al. | 427/66 |
| 5,920,080 A | | 7/1999 | Jones | 257/40 |
| 6,084,349 A | * | 7/2000 | Ueoka et al. | 313/587 |
| 6,097,149 A | | 8/2000 | Miyaji et al. | 313/582 |

FOREIGN PATENT DOCUMENTS

WO    WO 99/04604    1/1999

* cited by examiner

*Primary Examiner*—Shrive P. Beck
*Assistant Examiner*—Michael Cleveland
(74) *Attorney, Agent, or Firm*—Wood, Herron & Evans, L.L.P.

(57) ABSTRACT

Light emissive devices incorporating a low-reflectance black or color dielectric layer into their layered structure for improving the contrast of the emitted light. The black or color dielectric layer comprises a layer of a dielectric material having a network of passageways, such as pores or grain boundaries, and a colorant, such as black ink particles of a black ink additive, color ink particles of a color ink additive, or active particles of an organic dye, which is dispersed within the network of passageways. The presence of the colorant in the network of passageways significantly reduces the reflectivity of the dielectric layer. The light emissive devices of the present invention are applicable to improve the display contrast in various flat panel display technologies.

15 Claims, 4 Drawing Sheets

LIGHT EMISSIVE DISPLAY WITH A BLACK OR COLOR DIELECTRIC LAYER

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. MDA904-99-C-2597 awarded by The National Security Agency.

FIELD OF THE INVENTION

The present invention relates to light emissive devices and, in particular, to light emissive devices having an improved contrast ratio.

BACKGROUND OF THE INVENTION

Flat panel display technologies offer various advantages over conventional cathode ray tubes, such as a greatly reduced physical profile, lower power and voltage requirements, a reduced heat output, and lighter weight. For the next generation of flat panel displays, advances are being sought to improve display contrast, image brightness, efficiency, color purity, resolution, scalability, and reliability while also reducing the costs of fabrication. Light emissive flat panel displays generally include a layered structure of thin and thick films formed on a transparent front electrode and a transparent substrate. The layered structure is patterned as a rectangular array of active elements or pixels which are arranged in multiple rows and columns. To form an image, individual pixels radiate visible light when lit and are nominally dark when in an unlit state. The display contrast is quantified as the ratio between the brightness of a typical pixel when lit and the brightness of reflected light when that typical pixel is unlit. In standard operating environments, ambient light from sources such as sunlight and artificial room lighting is reflected by the unlit pixel and the surrounding area of the transparent panel. Pixel blooming is another phenomenon that degrades display contrast in which light from a lit pixel propagates through the plane of the transparent substrate and is emitted as visible light by adjacent pixels which may be in a nominally unlit state. To generate high contrast images, various conventional contrast-enhancement techniques are utilized either to reduce reflection of light by the flat panel display or to reduce pixel bloom.

One method of enhancing the contrast of a light emissive flat panel display is to apply a contrast-enhancement layer to the front transparent surface or glass panel of the display. Certain contrast-enhancement layers function as a polarizing filter to reduce the light reflected from the display by as much as 75 percent. Although polarizing filters improve the display contrast in most lighting conditions, they are costly and reduce the display brightness by more than 50 percent. Other contrast-enhancement layers function as anti-reflective films that eliminate the reflection of light at the front glass/air interface. However, anti-reflective films are only viable for those flat panel displays that include a non-reflective opaque layer within the layered structure that absorbs incident light. Often, the non-reflective opaque layer must be added to the layered structure as an additional layer. For enhancing the contrast of flat panel displays, polarizing filters and anti-reflective films have a significant limitation in that neither type of contrast-enhancement layer can alleviate pixel blooming. In fact, polarizing filters worsen pixel blooming.

Another method of enhancing the contrast of a light emissive flat panel display having a fully-transparent or semi-transparent display structure is to apply a light-absorbing layer on the non-light emitting side of the layered structure. The light-absorbing layer absorbs residual light from external sources transmitted through the transparent display structure without outward reflection by the various layer interfaces. However, a transparent conductor must be added to the layer structure to cover the light-emitting layer. This addition of the transparent conductor significantly increases the fabrication cost. Moreover, the light-absorbing layer is only viable for small-area displays because the lower conductivity of the requisite transparent conductor layer prevents the formation of long length electrodes.

Some conventional contrast-enhancement techniques tailor layers of the layered structure of thin and thick films forming the light emissive flat panel display to serve as contrast-enhancement layers. Tailoring of the existing essential layers eliminates the need for additional fabrication steps that add special purpose light-absorbing layers to the layered structure. For example, one contrast-enhancement technique for plasma displays provides the device electrodes with a black conductive layer formed from a paste of inert metal particles, such as silver or gold, and a black colorant additive. However, the black conductive layer is formed in front of the light emitting layer in the layered structure and, as a result, is not applicable for high-resolution displays in which the use of the black conductive layer would reduce the pixel aperture. Another contrast-enhancement technique applicable for thin film electroluminescent displays is to darken or blacken the rear metal electrode by fabricating it from a layer that has a composition graded from aluminum oxide to aluminum. However, the contrast enhancement afforded by such a blackened rear metal electrode is limited because the interfaces of the transparent layers overlying the blackened rear metal electrode still provide a significant reflection of the incident ambient light. Yet another contrast-enhancement technique applicable for thin film electroluminescent displays and direct current organic light emitting diode displays is to interpose a multilayer optical interference layer among the layers of the flat panel display that enhances the absorption of ambient light. In yet another contrast-enhancement technique, an insulating material, such as a plastic or an oxidized metal, is applied as a low-reflectance surface treatment in the lateral spaces separating adjacent pixels.

There is a need for a contrast-enhancement technique that is generally applicable to flat panel display technologies and which can be incorporated into the layered structure of the device with few additional fabrication steps or little added structure and without degrading the display properties of the flat panel display due to its incorporation.

SUMMARY OF THE INVENTION

The present invention is premised on the realization that with proper selection of thick film dielectric material and colorant, an electrically insulating dielectric layer, typically a thick film dielectric layer, found in most alternating current electroluminescent displays and alternating current plasma displays can be endowed with light-absorbing properties. According to the present invention, a dielectric layer, such as a thick film dielectric layer, can be rendered black for absorbing a broad range of the visible spectrum or, in the alternative, can be rendered colored to reflect only a specific range of wavelengths within the visible spectrum. The colorant, such as black pigment particles of a black ink additive, color pigment particles of a color ink additive, or active particles of a dye, does not significantly modify the dielectric constant of the layer so that it retains a high dielectric constant when used to pass alternating current.

According to an aspect of the present invention applicable in other light emissive flat panel display technologies, a color or black dielectric layer can be employed as an insulating layer/protective film on the rear surface of the display screen. The color or black dielectric layer is formed from a proper selection of a thick film dielectric material having a porous or polycrystalline microstructure and a colorant, such as active particles of an organic dye, black pigment particles of a black ink additive, or color pigment particles of a color ink additive. The presence of the colorant significantly reduces the reflectivity of the grain boundaries of the polycrystalline microstructure dielectric material or the pore walls of the porous microstructure dielectric material.

According to the present invention, the color or black dielectric layer is applied by standard techniques that produce the desired electrical and structural properties followed by coloring or blackening through the application of the colorant. As a result, little additional processing is required to introduce the color or black dielectric layer of the present invention into the fabrication of the layered structure of conventional flat panel displays. Furthermore, the present invention advantageously affords independent control of the electrical, structural, and optical properties of the dielectric layer. The electrical performance of the color or black dielectric layer of the present invention is comparable to other high performance black dielectric materials, such as plastics and oxidized metals, yet absorbs a much larger percentage of the incident ambient light than heretofore achievable with such standard high performance dielectrics. The black dielectric layer of the present invention provides high contrast when used in an electroluminescent flat panel display due to the darkening of the background about the pixels. The color dielectric of the present invention provides a vivid display appearance when used in an electroluminescent flat panel display, such as providing a dark blue background for a yellow light emission by a pixel.

The dielectric layers of the present invention have a thickness in a range between about 5 $\mu$m to about 100 $\mu$m and have colorant dispersed at grain boundaries or on the internal surfaces of pores throughout the thickness thereof. Thick film dielectric layers retain their electrically insulating character and are not susceptible to premature electrical breakdown, due to uniformity irregularities, which would cause a thin film dielectric layer to experience breakdown. Furthermore, thick film dielectric layers may be advantageously applied by screen printing, which is a simple, high yield, and easily scalable process.

The objects and advantages of the present invention will be further appreciated in light of the following detailed description and drawings in which:

DETAILED DESCRIPTION

Figure 1:
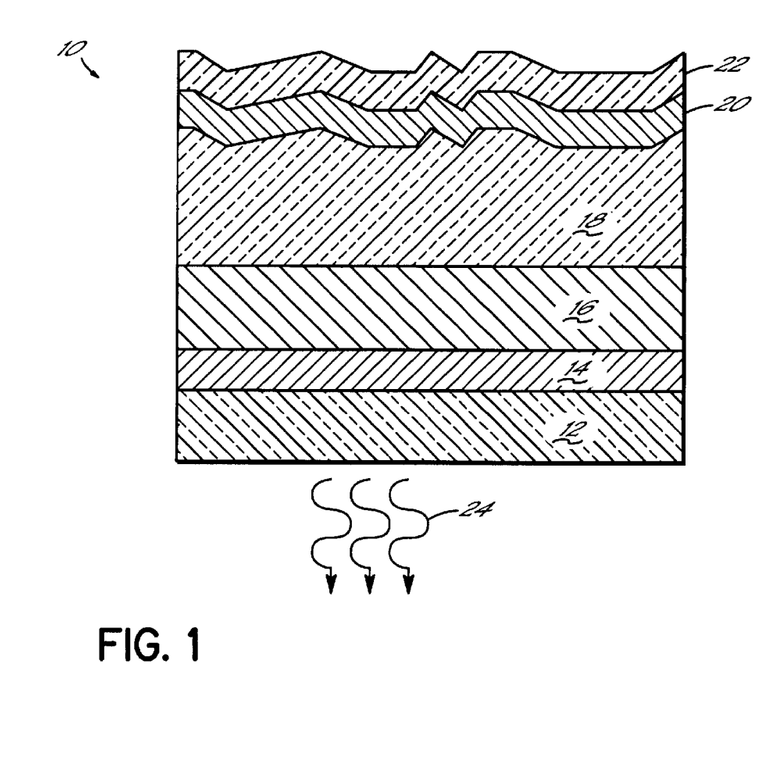
FIG. 1 is a sectional view of an alternating current thin film electroluminescent device of the present invention.

With reference to FIG. 1, an alternating current thin film electroluminescent device 10 of the present invention includes a glass substrate 12 covered by a layered structure comprising a transparent electrode 14, a high temperature electroluminescent phosphor layer 16, a dielectric layer 18, a metal rear electrode 20, and an glass encapsulant layer 22. When an alternating current is applied between the transparent electrode 14 and the metal rear electrode 20, the electroluminescent phosphor layer 16 emits visible light that is transmitted through the transparent electrode 14 and the glass substrate 12 as indicated diagrammatically by arrows 24.

A suitable glass substrate 12 is a Corning 1737 glass substrate, although other high temperature glasses, such as fused silica, are contemplated by the present invention. Suitable materials for the transparent electrode 14 include indium-tin oxide (ITO) and other metal oxides such as zinc oxide, tin oxide, indium oxide and mixtures thereof. The electroluminescent phosphor layer 16 is formed of a phosphor doped with a luminescent impurity such as, for example, gallium nitride doped with a transition or a rare earth metal, such as erbium or europium. The metal rear electrode 20 is formed of a high-conductive material, such as an alloy of silver and platinum. The glass encapsulant 22 is a material such as a Dupont 8185 or Honeywell Aclar film. The transparent electrode 14, the electroluminescent phosphor layer 16, the metal rear electrode 20, and the glass encapsulant layer 22 are successively applied to glass substrate 12 by methods known to those of ordinary skill in the art. In certain embodiments, the metal rear electrode 20 is deposited on the dielectric layer 18 by screen printing methods familiar to those of ordinary skill in the art.

According to the present invention, the dielectric layer 18, preferably a thick film dielectric layer, includes a dielectric material having a network of passageways, preferably open and interconnected, and a colorant comprising black pigment particles of a black ink additive positioned within the network of passageways to thereby reduce the reflectivity of dielectric layer 18. The network of passageways comprises either pores of a porous microstructure or grain boundaries of a polycrystalline microstructure. The network of passageways extends throughout a significant volume fraction of the dielectric layer 18 and, preferably, extends throughout substantially the entire volume fraction of the dielectric layer 18. Dielectric materials suitable for use in fabricating the dielectric layer 18 include, but are not limited to, a barium titanate, a lead niobiate, a lead titanate, a strontium titanate, a lead zirconate titanate, a silicon dioxide, and a lead oxide.

The dielectric material of the dielectric layer 18 may be formed by any conventional method of forming a thick film of a dielectric material having either a porous microstructure or a polycrystalline microstructure. The dielectric layer 18 generally has a thickness of about 5 microns to about 100 $\mu$m and, preferably, a thickness of between about 10 $\mu$m and about 40 $\mu$m. In certain embodiments, the dielectric material of the dielectric layer 18 is applied by screen-printing using, for example, a gel base material dried by heating at a first temperature, heated to a second temperature for densification, and heated to a third temperature to sinter the dielectric material to produce the desired electrical and structural properties. Typically, the gel base material is dried at a temperature of about 100° C. to remove the volatile carrier, densified at a temperature of about 600° C. for about 10 minutes, and sintered at a temperature of about 800–850° C. for about 1–10 minutes to provide the dielectric layer 18 with suitable electronic and physical characteristics. The dielectric material of the dielectric layer 18 resulting from the screen-printing process has a polycrystalline microstructure or a porous microstructure and a permittivity suitable for use in the present invention. An exemplary gel particularly useful in the screen-printing process of forming the dielectric material of the dielectric layer 18 is a barium-titanium-oxide screen-printed dielectric composition available under the trade name Dupont 5540 from Dupont Electronics (Research Triangle Park, N.C.) which provides a semi-transparent polycrystalline microstructure after firing. Alternate methods are contemplated by the present invention for forming dielectric layer 18 with a porous or a polycrystalline microstructure and include physical vapor deposition, spraying, sol-gel dip-coating, tape casting, and the like.

The black ink additive used to infiltrate the dielectric layer 18 preferably comprises the black pigment particles dispersed in a solvent-based (i.e., water-free) carrier liquid, such as a solvent mixture of ethylene glycol-monoethyl ether, ethylene glycol-monobutyl ether, benzyl alcohol and ethyl alcohol. The black pigment particles of the black ink additive significantly reduce the reflectivity of the semi-transparent grains or the pore walls of the dielectric material of the dielectric layer 18. As used herein, the term "semi-transparent" connotes any non-opaque condition that allows the transmission of a portion of incident visible light. Specifically, the black pigment particles of the black ink additive reduce the reflectivity of dielectric layer 18 so that at least a portion of the ambient visible light incident thereon is absorbed without reflection and the reflectivity of the dielectric layer 18 is less than the reflectivity of the semi-transparent dielectric material lacking the black ink additive. The black pigment particles of the black ink additive do not have to be dispersed within the network of passageways throughout the entire thickness of dielectric layer 18 but are merely required to be present over a thickness of dielectric layer 18 sufficient to reduce the reflectivity of the dielectric material.

The black pigment particles of the black ink additive are sized to be infiltrated into the network of passageways in the dielectric material of the dielectric layer 18. The carrier liquid mediates the fluidic transport of the black pigment particles into the dielectric material, after infiltration, is removed by heating. Specifically, the black pigment particles are sized with an average maximum dimension smaller than an average minimum dimension of the grain boundaries between the individual grains for the polycrystalline microstructure or smaller than a characteristic pore size for the porous microstructure. The average maximum dimension for the black pigment particles is believed to be less than, or equal to, about 1 $\mu$m. The black pigment particles are thermally stable at a temperature, typically about 100° C., operable to volatize and remove the carrier liquid from the dielectric layer 18 after infiltration. After the carrier liquid is volatized, the black pigment particles are positioned or entrapped on the confronting surfaces of the grain boundaries of the semi-transparent dielectric grains and are incorporated in the inter-granular gaps between coextensive dielectric grains. Similarly, the black pigment particles decorate the inner walls of the pores in the porous dielectric material after the carrier liquid is volatized. Preferably, the black ink additive does not detrimentally permeate, chemically modify, or decompose the dielectric grains or the electrical/structural interfaces between coextensive dielectric grains, the dielectric material surrounding the pores in the porous microstructure, or the electrical/structural interfaces of other layers, such as phosphor layer 16, in the layered structure of electroluminescent device 10. An exemplary black ink additive suitable for use in the present invention to reduce the reflectivity of the dielectric layer 18 is available commercially under the trade name Sanford #5153 from Sanford Corporation (Bellwood, Ill.).

Forming the network of passageways in the dielectric layer 18 before infiltrating the polycrystalline or porous microstructure with the black ink additive permits independent optimization of electrical and optical properties of the dielectric layer 18. Because the black pigment particles of the black ink additive are added to the dielectric material of the dielectric layer 18 after it is dried, densified and sintered, the dielectric material of dielectric layer 18 can be formed at higher temperatures that exceed those temperatures that the pigment particles of the ink additive can tolerate without significant degradation. This complete fabrication of the dielectric material of the dielectric layer 18 before the addition of the ink additive can be especially important because the dielectric material must normally be sintered at a temperature exceeding about 400° C., which would otherwise significantly degrade the black pigment particles of most conventional black ink additives.

The present invention is also useful with high temperature black ink additives having black pigment particles that are thermally stable at temperatures exceeding about 400° C. Such high temperature black ink additives may be required to practice the present invention due to high-temperature fabrication steps to form the finished flat panel display following formation of the dielectric layer 18. Black pigment particles that can withstand temperatures greater than or equal to about 1000° C. are known to those of ordinary skill in the art and are commercially available.

Figure 2:
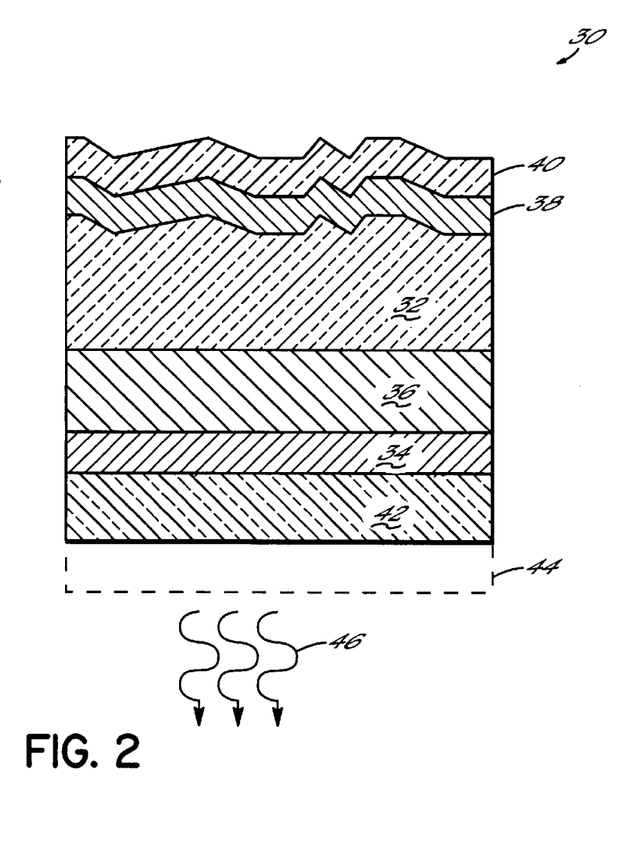
FIG. 2 is a sectional view of an alternating current thin film electroluminescent device according to an alternative embodiment of the present invention.

With reference to FIG. 2 and in an alternative embodiment of the present invention, an electroluminescent device 30 includes a dielectric layer 32 formed of a dielectric material and a colorant comprising color pigment particles of a color ink additive. The other layers forming electroluminescent device 30 include a transparent electrode 34, a high temperature electroluminescent phosphor layer 36, a metal rear electrode 38, and an glass encapsulant layer 40 deposited on a glass substrate 42. In certain embodiments, an anti-reflective film 44 may be applied to the light emitting surface of the glass substrate 42 but the present invention is not so limited. When an alternating current is applied between the transparent electrode 34 and the rear electrode 38, the electroluminescent phosphor layer 36 emits visible light transmitted through the transparent electrode 34 and the glass substrate 42 as indicated diagrammatically by arrows 46. The electroluminescent device 30 is substantially identical to electroluminescent device 10, other than the utilization of color pigment particles to reduce the reflectivity of dielectric layer 32 rather than the black pigment particles used to reduce the reflectivity of dielectric layer 18.

According to the present invention, the dielectric layer 32, preferably a thick film dielectric layer, includes a dielectric material having a network of passageways, preferably open and interconnected, and the color pigment particles of the color ink additive positioned in the network of passageways to thereby reduce the reflectivity of dielectric layer 32. The network of passageways comprises either pores of a porous microstructure or grain boundaries of a polycrystalline microstructure. The network of passageways extends throughout a significant volume fraction of the dielectric layer 32 and, preferably, extends throughout substantially the entire volume fraction of the dielectric layer 32. Dielectric materials suitable for use in fabricating the dielectric layer 32 include, but are not limited to, a barium titanate, a lead niobiate, a lead titanate, a strontium titanate, a lead zirconate titanate a silicon dioxide, and a lead oxide.

Similar to the black pigment particles of the black ink additive discussed above, the color pigment particles of the color ink additive are sized to be infiltrated into the network of passageways in the dielectric material of the dielectric layer 32. To that end, the color pigment particles are sized with an average maximum dimension smaller than an average minimum dimension of the grain boundaries between the individual grains for the polycrystalline microstructure or smaller than a characteristic pore size for the porous microstructure. The average maximum dimension for the color pigment particles is believed to be less than, or equal to, about 1 $\mu$m. The color pigment particles are transported into the dielectric material by the carrier liquid, which is removed by thermal volatization after infiltration. The color pigment particles are thermally stable at a temperature, typically about 100° C., operable to volatize and remove the carrier liquid from the dielectric layer 32 after infiltration. After the carrier liquid is volatized, the color pigment particles of the color ink additive are positioned or entrapped on the confronting surfaces of the grain boundaries of the semi-transparent dielectric grains. Similarly, the color pigment particles of the color ink additive decorate the inner walls of the pores in a porous dielectric material. Exemplary color ink additives suitable for use in the present invention to reduce the reflectivity of the dielectric layer 32 are available commercially from Sanford Corporation (Bellwood, Ill.) with a red pigment under the trade name Sanford #5833, with a green pigment under the trade name Sanford #5707, and with a blue pigment under the trade name Sanford #5706. Preferably, the color ink additive does not detrimentally permeate, chemically modify, or decompose the dielectric grains or the electrical/structural interfaces between coextensive dielectric grains, the dielectric material surrounding the pores in the porous microstructure, or the electrical/structural interfaces of other layers, such as phosphor layer 36, in the layered structure of electroluminescent device 30.

The color pigment particles of the color ink additive reduce the reflectivity of dielectric layer 32 so that at least a portion of the ambient light incident thereon is absorbed without reflection and the reflectivity of the dielectric layer 32 is less than the reflectivity of the semi-transparent dielectric material lacking the color ink additive. The portion of the light reflected by the dielectric layer 32 will acquire the hue of the color pigment particles of the color ink additive. The color pigment particles of the color ink additive do not have to be dispersed within the network of passageways throughout the entire thickness of dielectric layer 18 but are merely required to be present over a thickness of dielectric layer 18 sufficient to reduce the reflectivity of the dielectric material.

In an alternative embodiment of the present invention, an organic dye is infiltrated into the network of passageways in the dielectric material and the active particles of the organic dye, remaining after the carrier liquid of the organic dye is volatized, utilized as a colorant to participate in forming a dielectric layer according to the present invention, such as the dielectric layers 18 and 32. The active particles of the organic dye are sized with an average maximum dimension smaller than an average minimum dimension of the grain boundaries between the individual grains for the polycrystalline microstructure or smaller than a characteristic pore size for the porous microstructure. Typically, the active particles of the organic dye have a submicron size ranging from about 0.1 nm to about 5.0 nm. Such organic dyes are familiar to those of ordinary skill in the art.

One aspect of the present invention can be demonstrated by a comparison of the performance of an alternating current thin film electroluminescent device of the present invention, constructed with a layered structure according to FIG. 1, with the performance of a prior art alternating current thin film electroluminescent device, similar to the device of FIG. 1 but having a conventional dielectric layer instead of the low-reflectance dielectric layer of the present invention. In the following demonstration, a conventional method that monitors the light output measured the display contrast of each electroluminescent device. In each instance, the measurements were acquired under white ambient lighting conditions with an illuminance of about 140 lumen per square meter or lux. The transparent electrode and the metal rear electrode of each electroluminescent device were selectively biased with a series of AC voltages ranging from 0 V to about 120V in 10 volt increments and at a frequency of about 1 kHz to induce the emission of visible light. Above a certain voltage threshold, the light output by the biased electroluminescent device exceeded the ambient light reflected therefrom with no applied bias voltage. The display contrast is given as the ratio of the luminance when the AC voltage is applied to induce light emission and the luminance when the AC voltage is absent so that the only light emission is due to reflected ambient light.

Figure 3:
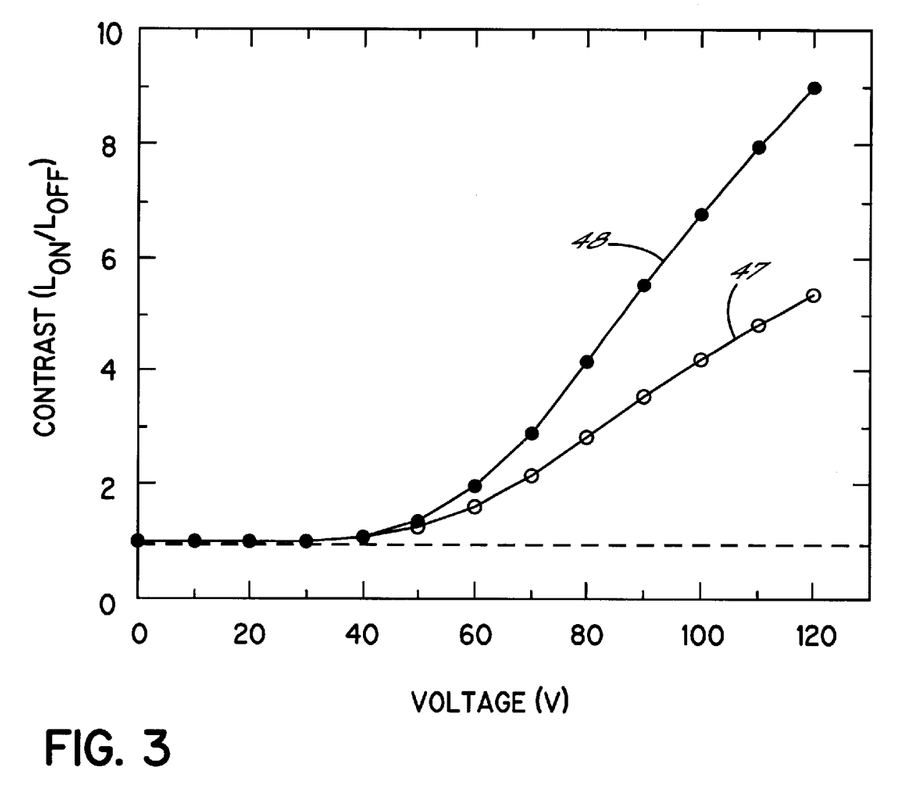
FIG. 3 is a graphical representation of the display contrast as a function of voltage of an alternating-current thin film electroluminescent device constructed according to FIG. 1.

With reference to FIG. 3, Curve 47 graphically depicts the contrast ratio of the prior art alternating current thin film electroluminescent device, similar to the device of FIG. 1, having a conventional dielectric layer instead of the opaque dielectric layer of the present invention. It can be observed that perceptible light emission onsets for an applied voltage between about 30 V and about 40 V. After an initial non-linear transition region, the light emission increases approximately linearly over the range of applied voltages between about 60 V and about 120 V. At the maximum applied voltage of about 120 V, the electroluminescent device constructed according to the prior art exhibited a contrast ratio of about 5:1.

With continued reference to FIG. 3, Curve 48 represents the contrast ratio of the alternating current thin film electroluminescent device having a dielectric layer according to the present invention and constructed with a layered structure as in FIG. 1. It can be observed that perceptible light emission onsets for an applied voltage between about 30 V and about 40 V. After an initial non-linear transition region, the light emission increases approximately linearly over the range of applied voltages between about 70 V and about 120 V. It is further observed that the slope of Curve 48 is greater than the slope of Curve 47, which indicates that the dielectric layer according to the present invention significantly reduces the light reflected by the device with no applied bias potential. At the maximum applied voltage of about 120 V, the electroluminescent device constructed with a low-reflectance dielectric layer according to the present invention exhibited a contrast ratio of about 9:1. It is apparent by a comparison of Curves 47 and 48 that a dielectric layer of the present invention improves the contrast ratio of an alternating current thin film electroluminescent device incorporating such a dielectric layer by about 80 percent.

Figure 4:
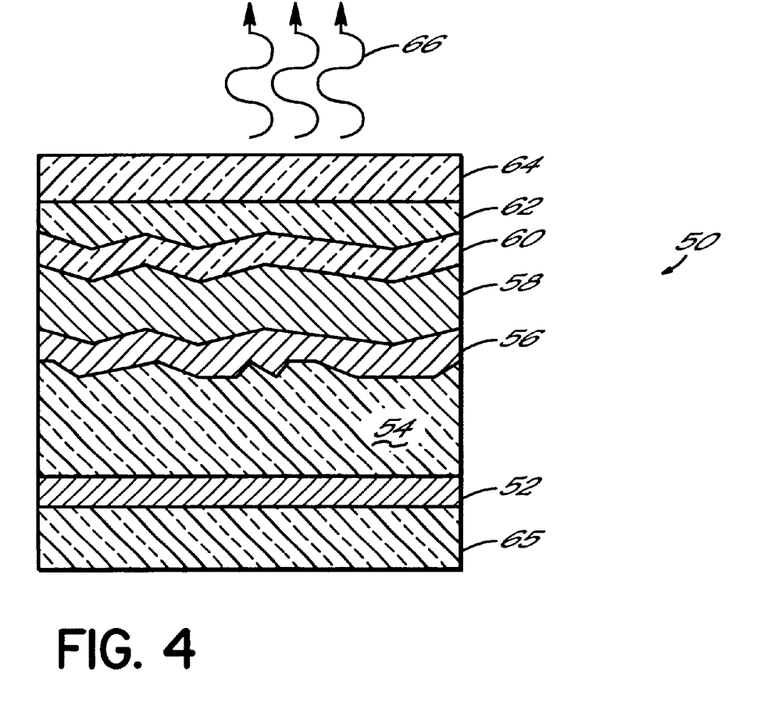
FIG. 4 is a sectional view of an inverted alternating current thin film electroluminescent device of the present invention.

The present invention is not limited to use in flat panel display technologies that rely on alternating current thin film electroluminescent devices but finds a more general applicability in multiple, other flat panel display technologies. With reference to FIG. 4, an inverted alternating current thin film electroluminescent device 50 has a layered structure comprising a metal rear electrode 52, a dielectric layer 54 formed of, for example, a barium titanate, a lead zirconate titanate (PZT) layer 56, an electroluminescent phosphor layer 58, a transparent electrode 60, a transparent glass encapsulant layer 62, and a sealing glass layer 64 formed on an opaque ceramic substrate 65. The electroluminescent phosphor layer 58 is formed of a phosphor host, such as zinc sulfide, calcium sulfide, or strontium sulfide, doped with a luminescent impurity, such as cerium, manganese, terbium, samarium, europium, or thulium. When an alternating current is applied between the transparent electrode 60 and the metal rear electrode 52, the electroluminescent phosphor layer 58 is induced to emit visible light transmitted through the transparent electrode 60, the transparent glass encapsulant layer 62, and the sealing glass layer 64 as indicated diagrammatically by arrows 66.

According to the present invention, the dielectric layer 54, preferably a thick film dielectric layer, includes a dielectric material having a network of passageways, preferably open and interconnected, and a colorant, such as black pigment particles of a black ink additive, color pigment particles of a color ink additive, or active particles of an organic dye, dispersed within the network of passageways to thereby reduce the reflectivity of dielectric layer 54. The network of passageways comprises either grain boundaries of a polycrystalline microstructure or pores of a porous microstructure. The network of passageways extends throughout a significant volume fraction of the dielectric layer 54 and, preferably, extends throughout substantially the entire volume fraction of the dielectric layer 54. Dielectric materials suitable for use in fabricating the dielectric layer 54 include, but are not limited to, a barium titanate, a lead niobiate, a lead titanate, a strontium titanate, and a lead zirconate titanate. The dielectric material of the dielectric layer 54 is formed on the ceramic substrate 65, for example, by screen-printing and sintering at a temperature greater than about 800° C.

According to the present invention, the passageways of the dielectric material are infiltrated with the carrier liquid carrying the colorant, in a manner analogous to that discussed above in the context of alternating current thin film electroluminescent devices, for improving the display contrast. In particular, the addition of the black pigment particles of a black ink additive is expected to optimize the improvement in display contrast. The pigment particles or active particles of the colorant reduce the reflectivity of dielectric layer 54 so that at least a portion of the ambient light incident thereon is absorbed without reflection and the reflectivity of the dielectric layer 54 is less than the reflectivity of the semi-transparent dielectric material lacking the pigment particles or the active dye particles. The pigment particles or the active dye particles of the colorant do not have to be dispersed within the network of passageways throughout the entire thickness of dielectric layer 54 but are merely required to be present over a thickness of dielectric layer 54 sufficient to reduce the reflectivity of the dielectric material. For color pigment particles of color ink additives, light reflected by the dielectric layer 54 will acquire the hue of the color pigment particles of the color ink additive.

Figure 5:
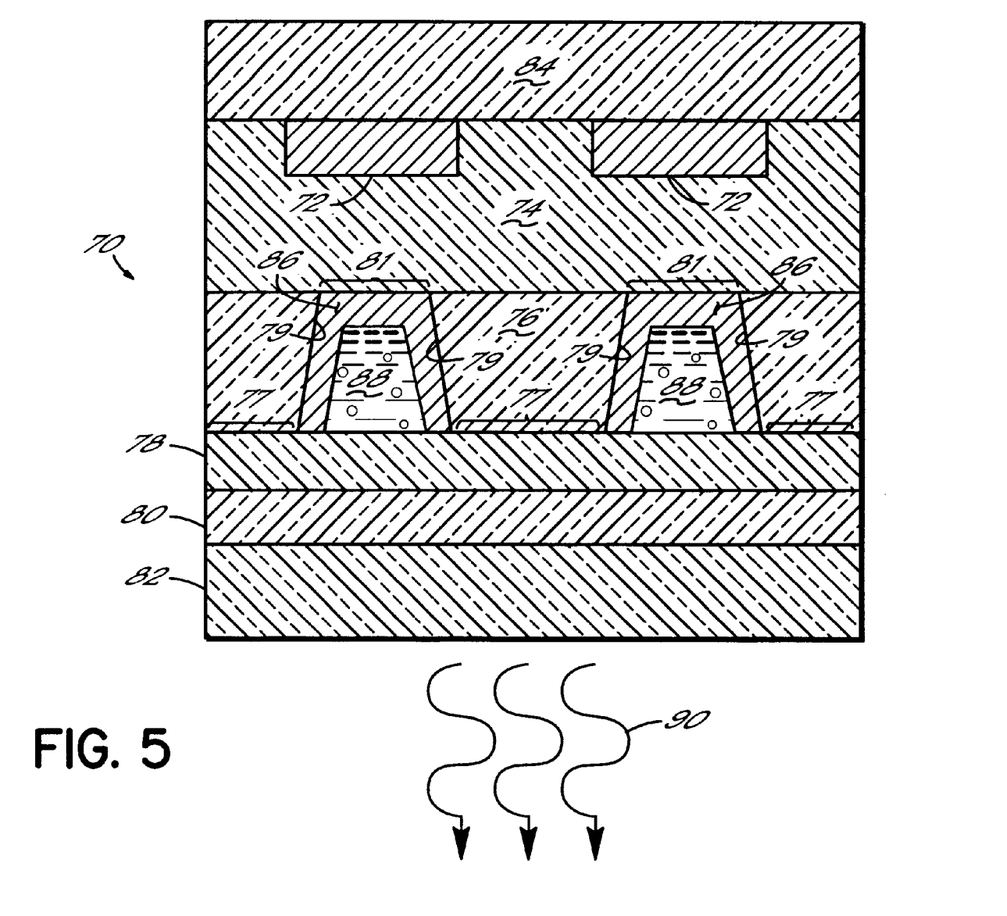
FIG. 5 is a sectional view of a plasma electroluminescent device of the present invention.

With reference to FIG. 5, a layered structure characteristic of a plasma photoluminescent device 70 suitable for a plasma flat panel display generally includes a plurality of metal rear electrode lines 72, a rear dielectric layer 74, a dielectric layer 76 patterned to define and enclose a plurality of cavities 88, a transparent dielectric layer 78, a transparent electrode 80, and a front glass substrate 82 sequentially formed on a rear glass substrate 84. The interior surfaces of cavities 88 defined by the dielectric layer 76 are coated with a red phosphor layer 86 and each cavity 88 contains a plasma gas, such as a mixture of xenon and neon. The rear dielectric layer 74 functions to couple an alternating current into the plasma gas. The dielectric layer 76 electrically and optically isolates the cavities 88 that define individual plasma cells that form pixels of the plasma flat panel display. When an alternating current is applied between the transparent electrode 80 and one of the metal rear electrode lines 72, a plasma created in the plasma gas within cavity 88 provides energetic photons that excite the red phosphor layer 86. Because of the excitation, the red phosphor layer 86 emits visible light transmitted through the transparent dielectric layer 78, the transparent electrode 80, and the front glass substrate 82, as indicated diagrammatically by arrows 90.

According to the present invention, the dielectric layer 76, preferably a thick film dielectric layer, has a network of passageways, preferably open and interconnected, and a colorant, such as black pigment particles of a black ink additive, color pigment particles of a color ink additive, or active particles of an organic dye, positioned within the passageways of the dielectric layer 76. Dielectric layer 76 is similar to the dielectric layers 18, 32 and 54 discussed above. As a result of the addition of the colorant, the reflection of ambient light will be reduced or eliminated from portions 77 of the dielectric layer 76 coextensive with the transparent dielectric layer 78 and thereby improve the display contrast. In particular, the addition of the black pigment particles of the black ink additive is believed to optimize the improvement in display contrast. If the red phosphor layer 86 is at least semi-transparent, ambient light will traverse inclined side walls 79 of the phosphor layer 86 and also be absorbed by the colorant in dielectric layer 76. Also according to the present invention, the rear dielectric layer 74, preferably a thick film dielectric layer, has a network of passageways, preferably open and interconnected, and a colorant, such as black pigment particles of a black ink additive, color pigment particles of a color ink additive, or active particles of an organic dye, dispersed within the network of passageways within the dielectric layer 74, which is similar to the dielectric layers 18, 32, 54 and 76 discussed above. As a result, ambient light that traverses the rear walls of the phosphor layer 86 will be absorbed by the colorant in coextensive portions 81 of the rear dielectric layer 74. The display contrast is significantly improved by reducing the ambient light reflected from inside the individual pixel cells. The network of passageways in rear dielectric layer 74 and in dielectric layer 76 comprises either grain boundaries of a polycrystalline microstructure or pores of a porous microstructure. The network of passageways extends throughout a significant volume fraction of each of the dielectric layers 74, 76 and, preferably, extends throughout substantially the entire volume fraction of each of the dielectric layers 74, 76. It is understood by those of ordinary skill in the art that an anti-reflective film (not shown) may be applied to the front of plasma device 70 for further improving the display contrast.

The colorant reduces the reflectivity of rear dielectric layer 74 and dielectric layer 76 so that at least a portion of the ambient light incident thereon is absorbed without reflection and the reflectivity of the dielectric layers 74, 76 is less than the reflectivity of the semi-transparent dielectric material lacking the colorant. The pigment particles or the active dye particles of the colorant do not have to be dispersed within the network of passageways throughout the entire thickness of dielectric layers 74, 76 but are merely required to be present over a thickness of dielectric layers 74, 76 sufficient to reduce the reflectivity of the dielectric material. For color pigment particles of color ink additives, light reflected by either of the dielectric layers 74, 76 will acquire the hue of the color pigment particles of the color ink additive.

Figure 6:
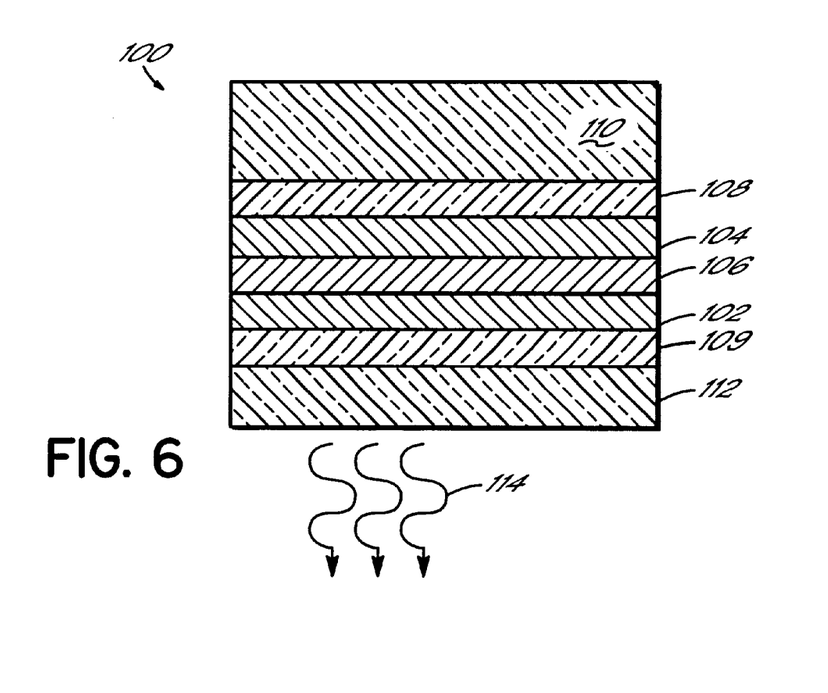
FIG. 6 is a sectional view of an organic electroluminescent device of the present invention.

With reference to FIG. 6, a layered structure characteristic of an organic light emitting diode 100 suitable to fabricate an organic electroluminescent flat panel display generally includes a series of organic thin films, such as a layer 102 of an organic hole-transporting material such as TAD, a layer 104 of an aluminum hydroxyquinoline (Alq), and a layer 106 of Alq doped with an organic dye to shift the emission color, sandwiched between a rear transparent electrode 108 and a front transparent electrode 109. The rear transparent electrode 108 is covered by a protective layer 110 and the layered structure is deposited on a glass substrate 112. The protective layer 110 acts as an electrically-insulating and environmental protectant layer at the rear of the organic light emitting diode 100. When electrical current is applied between the front transparent electrode 109 and the rear transparent electrode 108, the organic thin film layers 102, 104 and 106 cooperate to emit visible light of a given wavelength, as indicated diagrammatically by arrows 114.

According to the present invention, the protective layer 110 is deposited with a network of passageways, preferably open and interconnected, and a colorant, such as black pigment particles of a black ink additive, color pigment particles of a color ink additive, or active particles of an organic dye are positioned in the network of passageways. The protective layer 110 is similar to the dielectric layers 18, 32, 54, 74 and 76 discussed above but may also be a dielectric material having a relatively lower dielectric constant. In particular, the addition of the black pigment particles of the black ink additive is expected to optimize the improvement in display contrast. The network of passageways of protective layer 110 comprises either grain boundaries of a polycrystalline microstructure or pores of a porous microstructure. The network of passageways extends throughout a significant volume fraction of the protective layer 110 and, preferably, extends throughout substantially the entire volume fraction of the protective layer 110. Because the rear transparent electrode 108 and the front transparent electrode 109 are transparent, ambient light can penetrate the layered structure of the organic light emitting diode 100 and impinge on the protective layer 110. According to the present invention, the colorant in the protective layer 110 absorbs the incident ambient light and, thereby, improves the display contrast by significantly reducing or eliminating the reflection of the incident ambient light. To avoid degrading the organic thin film layers 102, 104 and 106, the dielectric material of the protective layer 110 may be formed from a dielectric material, such as a screen printable dielectric material, that requires no sintering. Such dielectric materials are familiar to those of ordinary skill in the art.

The colorant reduces the reflectivity of protective layer 110 so that at least a portion of the ambient light incident thereon is absorbed without reflection and the reflectivity of the protective layer 110 is less than the reflectivity of the semi-transparent dielectric material lacking the colorant. The pigment particles or the active dye particles of the colorant do not have to be dispersed within the network of passageways throughout the entire thickness of protective layer 110 but are merely required to be present over a thickness of protective layer 110 sufficient to reduce the reflectivity of the dielectric material. For color ink additives, light reflected by the protective layer 110 will acquire the hue of the color pigment particles of the color ink additive.

The invention will be further appreciated in light of the following examples.

EXAMPLE 1

About 300 nm of an indium-tin-oxide film was deposited on Corning 1737 glass substrate. The glass substrate has a thermal strain point of 666° C., which is sufficiently above the about 600° C. substrate temperature used during gallium nitride phosphor deposition. Corning 1737 is a widely utilized display glass due to its compatibility with low temperature (500° C.–600° C.) poly-Si processing used for active-matrix liquid crystal displays. Approximately 1 micron thick europium doped gallium nitride phosphor film was deposited by solid-source molecular beam epitaxy onto the indium-tin-oxide coated 1737 glass substrates. Following phosphor deposition, one layer of Dupont 5540 dielectric paste was screen printed, dried, densified for 10 minutes at about 600° C., and sintered at about 800° C. for 4 minutes. The resulting dielectric layer had a thickness of about 20 microns, a breakdown strength greater than about 200 V, and a dielectric constant or permittivity, $\epsilon$, of about 500 farad per meter (F/m) to about 1000 F/m. Rear electrodes were formed by sputtering of tantalum metal and/or printing and drying of Ag paste. When biased with an alternating voltage source, the europium doped gallium nitride electroluminescent device exhibited a red emission with a maximum luminance value of about 25 candela per square meter ($cd/m^2$) at 120 V, 1 kHz biasing. In ambient office lighting of 140 lux, the device exhibited a contrast ratio of 5:1 at 120V, 1 kHz biasing.

EXAMPLE 2

A device similar to that of Example 1 was formed with the following changes to fabrication of the thick-film dielectric layer. Following phosphor deposition, 1 layer of Dupont 5540 dielectric paste was screen printed, dried, densified for 10 minutes at about 600° C., and sintered at about 800° C. for 4 minutes. Rear electrodes were formed by sputtering of Ta metal and/or printing and drying of Ag paste. After electrode formation, Sanford #5153 ink was applied to the thick dielectric layer. The ink was then dried at about 120° C. for 10 min. The resulting black dielectric layer retained the same dielectric constant and breakdown voltage as the un-dyed dielectric layer. The rear electrodes were also unchanged electrically. When biased with an alternating voltage source, the europium doped gallium nitride electroluminescent device exhibited a red emission with a maximum luminance value of about 18 $cd/m^2$ at 120 V, 1 kHz biasing. In ambient office lighting of 140 lux, the device exhibited a contrast ratio of 9:1 at 120V, 1 kHz biasing. Even though the dielectric layer absorbs a fraction (7 $cd/m^2$) of the emitted light, the resulting device contrast improved twofold. It should be noted that implementation of an anti-reflective film onto the external surface of the glass substrate would increase this contrast ratio to well above 20:1.

EXAMPLE 3

A device similar to that of Example 1 was formed with the following changes to fabrication of the thick-film dielectric layer. Following phosphor deposition, one layer of Dupont 5540 dielectric paste was screen printed, dried, densified for 10 minutes at about 600° C., and sintered at about 800° C. for 4 minutes. Rear electrodes were formed by sputtering of Ta metal and/or printing and drying of Ag paste. After electrode formation, a high temperature black paint manufactured by Tempil Inc. (South Plainfield, N.J.) under the Pyromark trade name was applied to the Ag electrodes and thick dielectric layer. The paint was dried at 120° C. for 30 min. The color of the dielectric layer did not change because the black pigment particles in the black paint have dimensions that prohibit infiltration into the dielectric layer for reducing the reflectivity thereof and, as a result, the device contrast is not significantly improved.

EXAMPLE 4

A device similar to that of Example 1 was formed with the following changes to fabrication of the thick-film dielectric layer. Following phosphor deposition, one layer of semi-transparent lead niobate dielectric paste was screen printed, dried, and sintered. Rear electrodes were formed by sputtering of Ta metal and/or printing and drying of Ag paste. After electrode formation Sanford #5153 ink was applied to part of sample. Similarly red, green, and blue inks were applied to the samples. The inks were then dried. The resulting black and color dielectric layer retained the same dielectric constant and breakdown voltage as the un-dyed dielectric layer. The rear electrodes were also unchanged electrically. The electroluminescent device displayed red light emission. The electroluminescent devices formed in a sample region with no addition of ink had a poor contrast value and exhibited a reflected color of whitish-yellow. The electroluminescent devices formed in a sample region with the addition of blue or green ink had improved contrast value and exhibited a reflected color of blue or green, respectively. The electroluminescent devices formed in a sample region with the addition of red ink had improved contrast value in term of brightness but exhibited poor color contrast since it exhibited a red reflected color.

The present invention can then be used to form a flat screen display device utilizing the embodiments of the light-emitting devices shown in FIGS. 1–2 and 4–6, in an addressable matrix or array to form a flat screen display device such as a television, a computer monitor or the like. Further, the dielectric layers of the present invention significantly reduce the reflection of ambient light by the flat screen display device for improving the display contrast. Moreover, the cost and yield of manufacturing is significantly improved due to the ability to fabricate the dielectric layers by screen-printing and then to modify the dielectric layers, after fabrication, by the simple infiltration of a black ink additive, a color ink additive, or a dye to endow the dielectric layer with its light absorptive or low-reflectance properties.

This has been a description of the present invention along with a preferred method of practicing the invention. However, the invention itself should be defined only by the appended claims, wherein

We claim:

1. A method of forming a light-emitting device of a flat panel display on a substrate, the light-emitting device including a rear electrode, a light-emitting layer, and a transparent front electrode that transmits light emitted by the light-emitting layer, the method comprising:

applying a layer of a dielectric material between the rear electrode and the light-emitting layer, the dielectric material having a network of passageways; and dispersing a colorant within the network of passageways of the dielectric material, the colorant operable to reduce the reflectivity of the dielectric material.

2. The method of claim 1 wherein the step of applying the layer of the dielectric material comprises:

screen-printing a layer of a dielectric base material;

heating the layer to a first temperature effective to cause the dielectric base material to dry;

subsequently heating the layer to a second temperature effective to cause the dielectric base material to densify; and subsequently heating the layer to a third temperature effective to sinter the dielectric base material to thereby provide the layer of the dielectric material.

3. The method of claim 2 wherein the network of passageways is defined by coextensive grains of dielectric material having interfaces fused together by sintering, and the interfaces are substantially free of colorant dispersed into the network of passageways.

4. The method of claim 1 wherein the step of dispersing occurs after the step of applying the layer of the dielectric material.

5. The method of claim 1 wherein the network of passageways extends throughout a significant volume fraction of the layer of the dielectric material.

6. The method of claim 1 wherein the network of passageways extends throughout substantially the entire volume fraction of the layer of the dielectric material.

7. The method of claim 1 wherein the dielectric material is a material selected from the group consisting of a barium titanate, a lead niobiate, a lead titanate, a strontium titanate, a lead zirconate titanate, a silicon dioxide, a lead oxide, and combinations thereof.

8. The method of claim 1 wherein the colorant is a material selected from the group consisting of active particles of an organic dye, black pigment particles of a black ink additive, color pigment particles of a color ink additive, and combinations thereof.

9. The method of claim 1 wherein the network of passageways is an open network of interconnected passageways.

10. The method of claim 1 wherein the step of dispersing includes positioning colorant within the network of passageways over a thickness of the dielectric layer sufficient to reduce the reflectivity of the dielectric material.

11. The method of claim 1 wherein the network of passageways is defined by coextensive grains of dielectric material having interfaces substantially free of colorant dispersed into the network of passageways.

12. The method of claim 1 wherein the layer of the dielectric material is applied on the rear electrode.

13. The method of claim 12 wherein the substrate is opaque, and further comprising applying the rear electrode on the substrate.

14. The method of claim 1 wherein the layer of the dielectric material is applied on the light-emitting layer.

15. The method of claim 14 wherein the substrate is transparent, and further comprising:

applying the transparent front electrode on the substrate;

applying the light-emitting layer on the transparent front electrode; and applying the rear electrode on the layer of the dielectric material.

* * * * *